United States Patent
Chiu et al.

(10) Patent No.: US 9,773,852 B2
(45) Date of Patent: Sep. 26, 2017

(54) ORGANIC ELECTROLUMINESCENCE DISPLAY

(71) Applicant: EverDisplay Optronics (Shanghai) Limited, Shanghai (CN)

(72) Inventors: Chang-Ming Chiu, Shanghai (CN); Ying-Hsiang Tseng, Shanghai (CN)

(73) Assignee: EVERDISPLAY OPTRONICS (SHANGHAI) LIMITED, Shanghai (CN)

(*) Notice: Subject to any disclaimer, the term of this patent is extended or adjusted under 35 U.S.C. 154(b) by 178 days.

(21) Appl. No.: 14/597,232

(22) Filed: Jan. 15, 2015

(65) Prior Publication Data
US 2016/0049455 A1    Feb. 18, 2016

(30) Foreign Application Priority Data
Aug. 12, 2014 (CN) .......................... 2014 1 0394808

(51) Int. Cl.
*H01L 27/32* (2006.01)
*G09G 3/3233* (2016.01)

(52) U.S. Cl.
CPC ...... *H01L 27/3276* (2013.01); *H01L 27/3262* (2013.01); *G09G 3/3233* (2013.01); *G09G 2300/0426* (2013.01)

(58) Field of Classification Search
CPC .............. H01L 27/3262; H01L 27/326; H01L 27/6276; H01L 27/3279
See application file for complete search history.

(56) References Cited

U.S. PATENT DOCUMENTS

| | | | |
|---|---|---|---|
| 2004/0183767 A1* | 9/2004 | Koo | G09F 9/30 345/92 |
| 2013/0201634 A1 | 8/2013 | Im et al. | |

FOREIGN PATENT DOCUMENTS

| | | |
|---|---|---|
| CN | 1527260 A | 9/2004 |
| CN | 102779834 A | 11/2012 |
| CN | 103927970 A | 7/2014 |
| KR | 2010-0021311 A | 2/2010 |
| TW | 200807380 A | 2/2008 |

* cited by examiner

*Primary Examiner* — Daniel Shook
(74) *Attorney, Agent, or Firm* — CKC & Partners Co., Ltd.

(57) ABSTRACT

An organic electroluminescence display includes a plurality of scan lines, a plurality of data lines, at least one first pixel circuit, and at least one second pixel circuit. The scan lines and the data lines cross. Each of the first and second pixel circuits is electrically connected to one of the scan lines and one of the data lines. The first pixel circuit includes at least one first driving transistor having a first channel in a first channel direction. The second pixel circuit includes at least one second driving transistor having a second channel in a second channel direction. The second channel direction is different from that of the first channel direction.

14 Claims, 5 Drawing Sheets

ORGANIC ELECTROLUMINESCENCE DISPLAY

RELATED APPLICATIONS

This application claims priority to Chinese Patent Application with Serial Number of 201410394808.2, filed on Aug. 12, 2014, which is herein incorporated by reference.

BACKGROUND

Technical Field

The present disclosure relates to organic electroluminescence displays.

Description of Related Art

An electroluminescence display is a kind of flat panel displays. The electroluminescence display includes an electroluminescence layer between two conductive layers. When an electric current flows through electroluminescence layer, the electroluminescence layer emits visible light. An organic electroluminescence display is an electroluminescence display of which the electroluminescence layer is made of one or more organic materials. More specifically, the organic electroluminescence display employs organic light-emitting diodes as its display elements.

Generally speaking, pixel circuits of the organic electroluminescence display control the electric currents flowing through the organic light-emitting diodes by driving transistors. The channels of the driving transistors can be formed by excimer laser annealing (ELA). However, the channels of the driving transistors formed by ELA may have non-uniform crystallization. The non-uniform crystallization leads to variations of the electric currents flowing through the channels of the driving transistors. That is, different electric currents may flow through the channels of the driving transistors in response to the same signals. The variations of the electric currents result in non-uniform luminance. The luminance deviations occurring in groups or periodically lead to mura defects, which are unfavorable features for an observer.

Some manufacturers tried to design pixel circuits to eliminate mura defects. The followings are some architectures for pixel circuits, such as: the 4T1C (4 transistors and 1 capacitor) architecture, the 4T2C (4 transistors and 2 capacitors) architecture, the 5T1C (5 transistors and 1 capacitor) architecture, the 6T1C (6 transistors and 1 capacitor) architecture, and the 6T2C (6 transistors and 2 capacitors) architecture etc. However, the pixel size is getting smaller with the increasing display resolution. Therefore, it becomes more and more difficult to form a complex pixel circuit in a small pixel.

SUMMARY

According to one embodiment of the present disclosure, an organic electroluminescence display includes a plurality of scan lines, a plurality of data lines, at least one first pixel circuit, and at least one second pixel circuit. The data lines and the scan lines cross. The first pixel circuit is electrically connected to one of the scan lines and one of the data lines. The first pixel circuit includes at least one first organic light-emitting diode and at least one first driving transistor. The first driving transistor is configured to actuate the first organic light-emitting diode. The first driving transistor has a first channel in a first channel direction. The second pixel circuit is electrically connected to one of the scan lines and one of the data lines. The second pixel circuit includes at least one second organic light-emitting diode and at least one second driving transistor. The second driving transistor is configured to actuate the second organic light-emitting diode. The second driving transistor has a second channel in a second channel direction. The second channel direction is different from that of the first channel direction.

According to another embodiment of the present disclosure, an organic electroluminescence display includes a plurality of scan lines, a plurality of data lines, at least one first pixel circuit, and at least one second pixel circuit. The data lines and the scan lines cross. The first pixel circuit is electrically connected to one of the scan lines and one of the data lines. The first pixel circuit includes at least one first organic light-emitting diode and at least one first driving transistor. The first driving transistor is configured to actuate the first organic light-emitting diode. The first driving transistor has a first channel in a first lengthwise direction. The second pixel circuit is electrically connected to one of the scan lines and one of the data lines. The second pixel circuit includes at least one second organic light-emitting diode and at least one second driving transistor. The second driving transistor is configured to actuate the second organic light-emitting diode. The second driving transistor has a second channel in a second lengthwise direction. The first lengthwise direction and the second lengthwise direction intersect.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
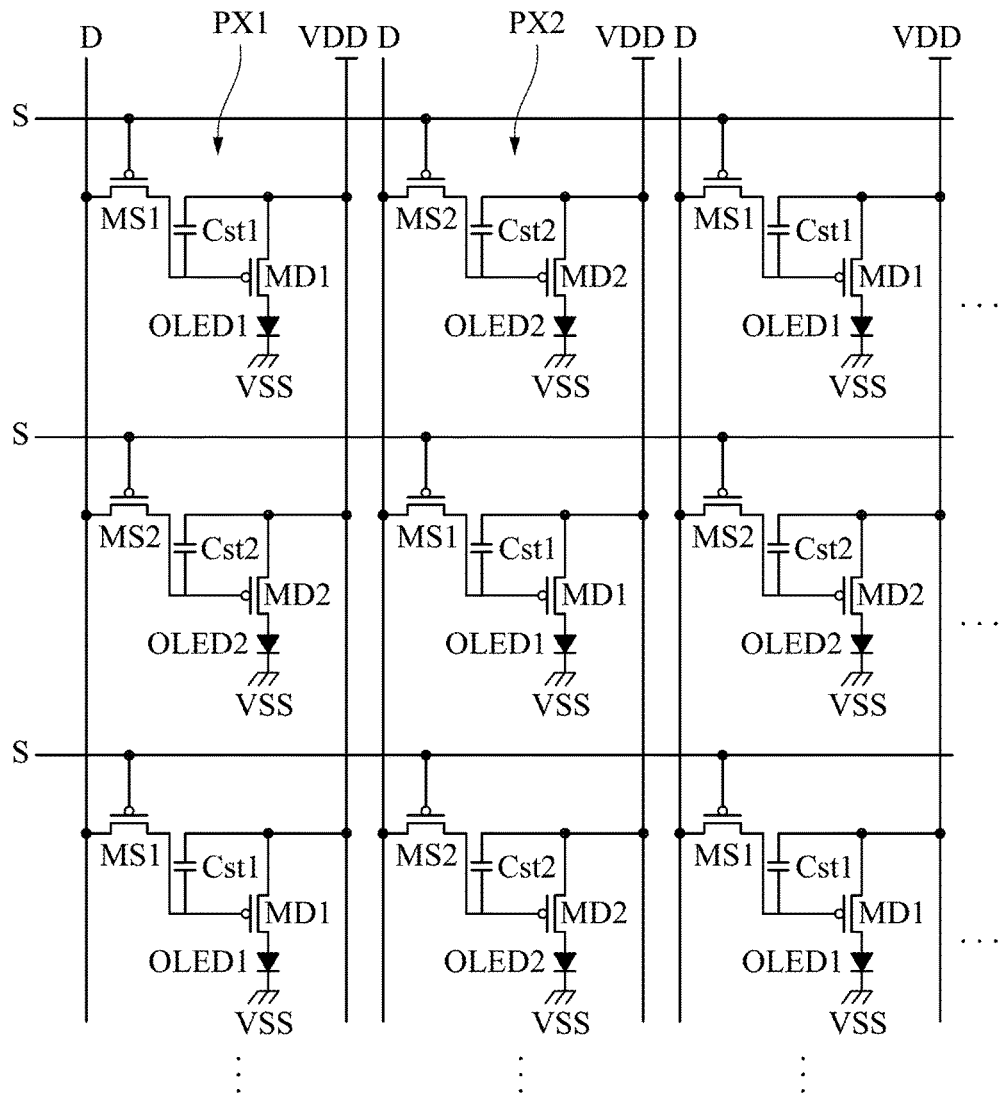
FIG. 1 is an equivalent circuit diagram of an organic electroluminescence display according to one embodiment of the present disclosure.
Figure 2:
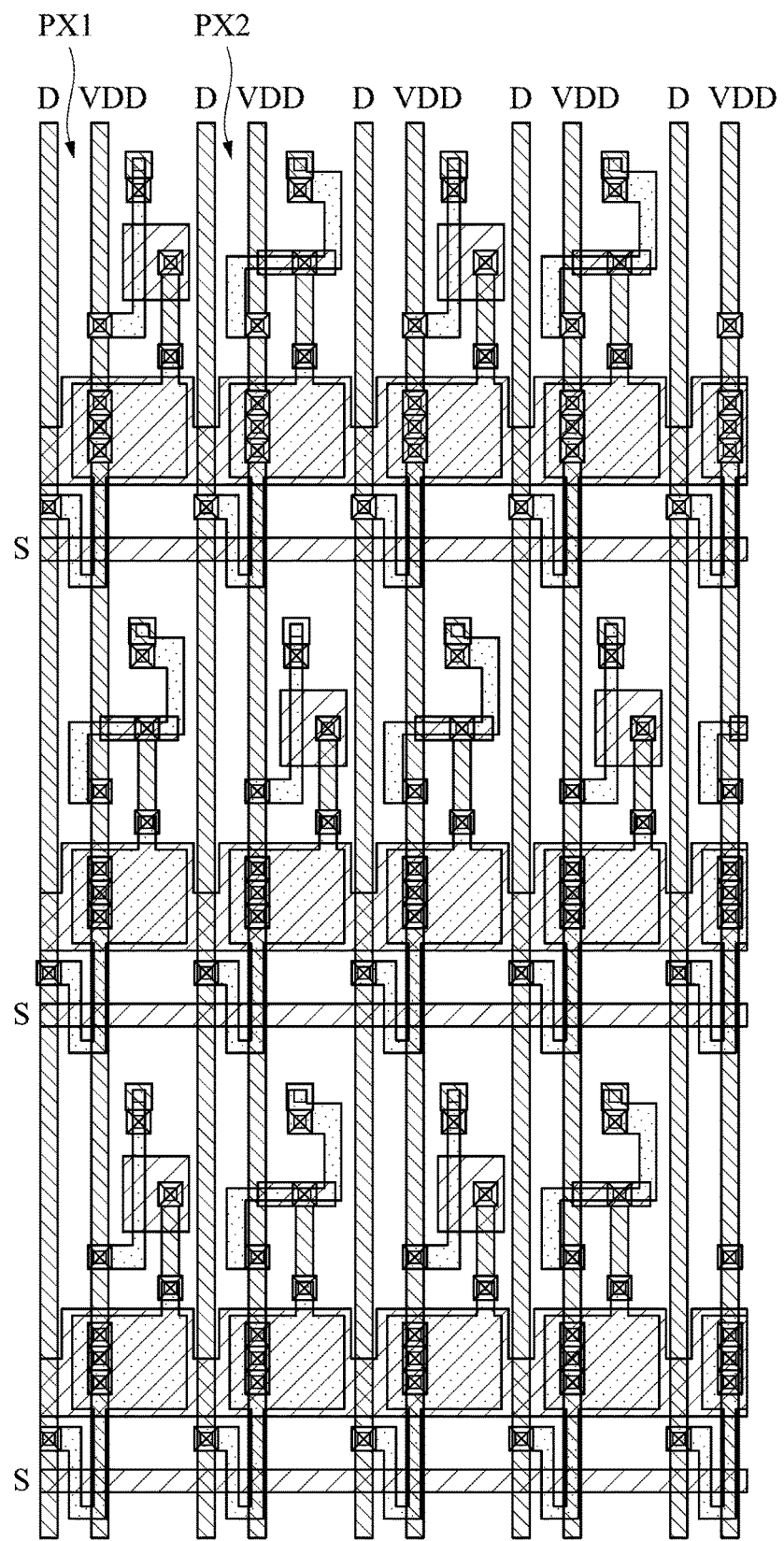
FIG. 2 is an illustration of a pixel circuit layout for the organic electroluminescence display of FIG. 1.

FIG. 1 is an equivalent circuit diagram of an organic electroluminescence display according to one embodiment of the present disclosure. FIG. 2 is an illustration of a pixel circuit layout for the organic electroluminescence display of FIG. 1. As shown in FIGS. 1 and 2, the organic electroluminescence display includes a plurality of scan lines S, a plurality of data lines D, at least one power supply line VDD, at least one first pixel circuit PX1, and at least one second pixel circuit PX2. The scan lines S and the data lines D cross. The first pixel circuit PX1 is electrically connected to one of the scan lines S and one of the data lines D. The first pixel circuit PX1 is further electrically connected to the power supply line VDD. The first pixel circuit PX1 includes at least one first organic light-emitting diode OLED1 and at least one first driving transistor MD1. If said one of the scan lines S electrically connected to the first pixel circuit PX1 provides a scan signal to the first pixel circuit PX1, and said one of the data lines D electrically connected to the first pixel circuit PX1 provides a data signal to the first pixel circuit PX1, the first driving transistor MD1 is turned on, such that electrical potential of the power supply line VDD is supplied to the first organic light-emitting diode OLED1 through the first driving transistor MD1.

The second pixel circuit PX2 is electrically connected to one of the scan lines S and one of the data lines D. The second pixel circuit PX2 is further electrically connected to the power supply line VDD. The second pixel circuit PX2 includes at least one second organic light-emitting diode OLED2 and at least one second driving transistor MD2. If said one of the scan lines S electrically connected to the second pixel circuit PX2 provides a scan signal to the second pixel circuit PX2, and said one of the data lines D electrically connected to the second pixel circuit PX2 provides a data signal to the second pixel circuit PX2, the second driving transistor MD2 is turned on, such that the electrical potential of the power supply line VDD is supplied to the second organic light-emitting diode OLED2 through the second driving transistor MD2.

Figure 3:
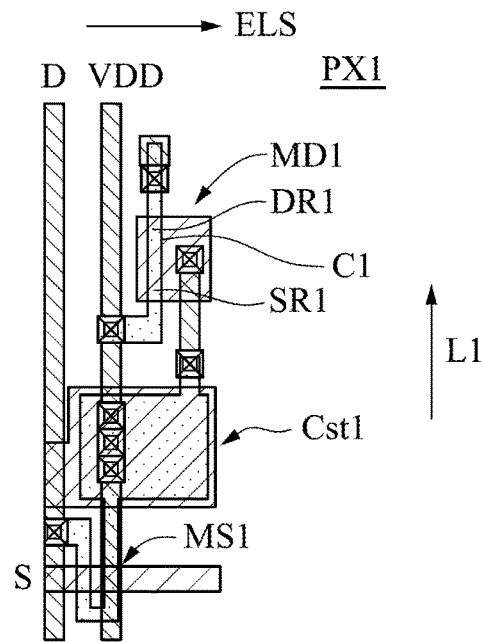
FIG. 3 is an illustration of a layout for the first pixel circuit of FIG. 1.
Figure 4:
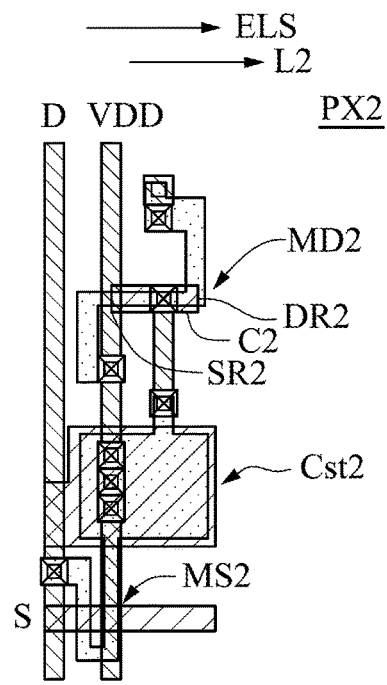
FIG. 4 is an illustration of a layout for the second pixel circuit of FIG. 1.

FIG. 3 is an illustration of a layout for the first pixel circuit PX1 of FIG. 1. FIG. 4 is an illustration of a layout for the second pixel circuit PX2 of FIG. 1. As shown in FIGS. 3 and 4, the first driving transistor MD1 has a first channel C1. The first channel C1 has a first channel direction L1. The second driving transistor MD2 has a second channel C2. The second channel C2 has a second channel direction L2. The first channel direction L1 and the second channel direction L2 intersect. That is, the first channel direction L1 and the second channel direction L2 are different from or non-parallel with each other.

In the present embodiment, the first channel C1 and the second channel C2 may still have non-uniform crystallization. Nevertheless, the electric currents through the first channel C1 and the second channel C2 have different variations or defects due to the difference between the first channel direction L1 and the second channel direction L2. Since the first pixel circuit PX1 and the second pixel circuit PX2 are together arranged, the variations or defects of the first pixel circuit PX1 and the second pixel circuit PX2 will not appear in groups or periodically to lead to mura defects.

In the present embodiment, since the mura defects are eliminated, both the first pixel circuit PX1 and the second pixel circuit PX2 can have a basic architecture of 2T1C (2 transistors and 1 capacitor). For example, as shown in FIG. 1, the first pixel circuit PX1 including the first organic light-emitting diode OLED1 and the first driving transistor MD1 further includes a first scanning transistor MS1 and a first capacitor Cst1. The gate electrode of the first scanning transistor MS1 is electrically connected to said one of the scan lines S electrically connected to the first pixel circuit PX1. The source electrode of the first scanning transistor MS1 is electrically connected to said one of the data lines D electrically connected to the first pixel circuit PX1. The drain electrode of the first scanning transistor MS1 is electrically connected to the gate electrode of the first driving transistor MD1 and one electrode of the first capacitor Cst1. The source electrode of the first driving transistor MD1 is electrically connected to the power supply line VDD and another electrode of the first capacitor Cst1. The drain electrode of the first driving transistor MD1 is electrically connected to one electrode of the first organic light-emitting diode OLED1. Another electrode of the first organic light-emitting diode OLED1 is electrically connected to the ground or a negative supply line VSS. In operation, the scan signal through said one of the scan lines S electrically connected to the first pixel circuit PX1 turns on the first scanning transistor MS1. The data signal through said one of the data lines D electrically connected to the first pixel circuit PX1 passes through the first scanning transistor MS1 to turn on the first driving transistor MD1, such that the electricity from the power supply line VDD passes through the first driving transistor MD1 to actuate the first organic light-emitting diode OLED1.

Similarly, the second pixel circuit PX2 including the second organic light-emitting diode OLED2 and the second driving transistor MD2 further includes a second scanning transistor MS2 and a second capacitor Cst2. The gate electrode of the second scanning transistor MS2 is electrically connected to said one of the scan lines S electrically connected to the second pixel circuit PX2. The source electrode of the second scanning transistor MS2 is electrically connected to said one of the data lines D electrically connected to the second pixel circuit PX2. The drain electrode of the second scanning transistor MS2 is electrically connected to the gate electrode of the second driving transistor MD2 and one electrode of the second capacitor Cst2. The source electrode of the second driving transistor MD2 is electrically connected to the power supply line VDD and another electrode of the second capacitor Cst2. The drain electrode of the second driving transistor MD2 is electrically connected to one electrode of the second organic light-emitting diode OLED2. Another electrode of the second organic light-emitting diode OLED2 is electrically connected to the ground or the negative supply line VSS. In operation, the scan signal through said one of the scan lines S electrically connected to the second pixel circuit PX2 turns on the second scanning transistor MS2. The data signal through said one of the data lines D electrically connected to the second pixel circuit PX2 passes through the second scanning transistor MS2 to turn on the second driving transistor MD2, such that the electricity from the power supply line VDD passes through the second driving transistor MD2 to actuate the second organic light-emitting diode OLED2.

Although the first pixel circuit PX1 and the second pixel circuit PX2 shown in FIGS. 1-4 have a basic architecture of 2T1C (2 transistors and 1 capacitor), the claimed scope of the present disclosure should not be limited thereto. In some embodiments, the first pixel circuit PX1 and the second pixel circuit PX2 may have other architectures, such as the 4T1C (4 transistors and 1 capacitor) architecture, the 4T2C (4 transistors and 2 capacitors) architecture, the 5T1C (5 transistors and 1 capacitor) architecture, the 6T1C (6 transistors and capacitor) architecture and the 6T2C (6 transistors and 2 capacitors) architecture etc. A person having ordinary skill in the art may select proper architectures for the first pixel circuit PX1 and the second pixel circuit PX2 based on actual demand.

As shown in FIG. 3, the first driving transistor MD1 has a first source electrode SR1 and a first drain electrode DR1. The first channel C1 electrically connects the first source electrode SR1 and the first drain electrode DR1, and the first channel direction L1 extends across the first source electrode SR1 and the first drain electrode DR1. Similarly, as shown in FIG. 4, the second driving transistor MD2 has a second source electrode SR2 and a second drain electrode DR2. The second channel C2 electrically connects the second source electrode SR2 and the second drain electrode DR2, and the second channel direction L2 extends across the second source electrode SR2 and the second drain electrode DR2.

In the present embodiment, the first channel direction L1 and the lengthwise direction of the first channel C1 are substantially the same. The second channel direction L2 and the lengthwise direction of the second channel C2 are substantially the same. The claimed scope of the present disclosure should not be limited thereto. A person having ordinary skill in the art may select proper first and second channel directions L1 and L2 based on actual demand.

The lengthwise direction means the direction of the longest side of something. This interpretation will be used in this article and the accompany claims and therefore will not be repeated hereinafter.

As shown in FIGS. 3 and 4, the first channel direction L1 and the second channel direction L2 are substantially orthogonal or perpendicular to each other. The relation between the first channel direction L1 and the second channel direction L2 shown in FIGS. 3 and 4 is one example only, the claimed scope of the present disclosure should not be limited thereto. A person having ordinary skill in the art may select proper first and second channel directions L1 and L2 based on actual demand.

More specifically, in the present embodiment, the first channel C1 and the second channel C2 are low temperature poly-silicon (LTPS) layers formed by excimer laser annealing (ELA). The ELA has a laser scanning direction ELS. At least one of the first and second channel directions L1 and L2 intersects with the laser scanning direction ELS. That is, the at least one of the first and second channel directions L1 and L2 is different from or non-parallel with that of the laser scanning direction ELS. The other of the first and second channel directions L1 and L2 is substantially parallel with the laser scanning direction ELS.

The LTPS layers formed by the ELA may have non-uniform crystallization. Generally speaking, the crystallization of the LTPS layers is non-uniform along the laser scanning direction ELS. Therefore, when electric currents through a LTPS layer along the laser scanning direction ELS and a direction different from that of the laser scanning direction ELS have different variations. In the present embodiment, the first channel direction L1 intersects with (i.e., is different from or non-parallel with) the laser scanning direction ELS. The second channel direction L2 is substantially the same as (i.e., substantially parallel with) the laser scanning direction ELS. Consequently, the electric currents through the first channel C1 and the second channel C2 have different variations. Since the first pixel circuit PX1 and the second pixel circuit PX2 are together arranged, the variations or defects of the first pixel circuit PX1 and the second pixel circuit PX2 will not appear in groups or periodically to lead to mura defects.

At least one of the first and second channel directions L1 and L2 is substantially orthogonal or perpendicular to the laser scanning direction ELS. In the present embodiment, the first channel direction L1 is substantially orthogonal or perpendicular to the laser scanning direction ELS. The relations among the first channel direction L1, the second channel direction L2, and the laser scanning direction ELS shown in FIGS. 3 and 4 are examples only, the claimed scope of the present disclosure should not be limited thereto. A person having ordinary skill in the art may select proper relations among the first channel direction L1, the second channel direction L2, and the laser scanning direction ELS.

Figure 5:
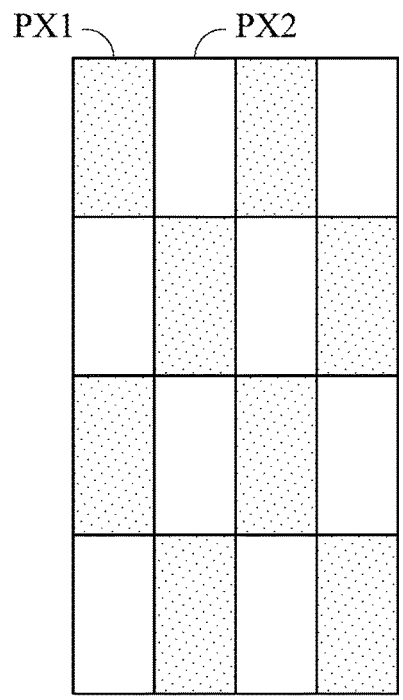
FIGS. 5-7 are schematic drawings, which show arrangements of the first pixel circuits and the second pixel circuits according to a plurality of embodiments of the present disclosure.
Figure 6:
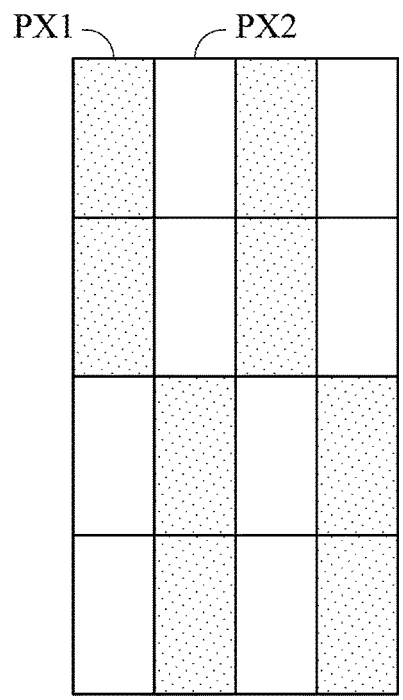
Figure 7:
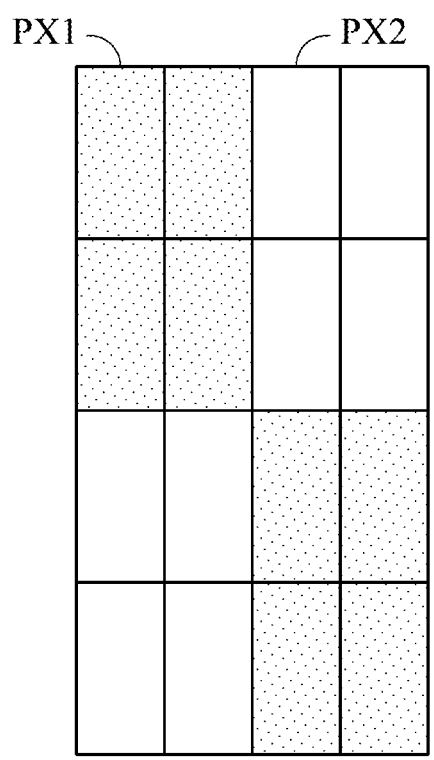

FIGS. 5-7 are schematic drawings, which show arrangements of the first pixel circuits PX1 and the second pixel circuits PX2 according to a plurality of embodiments of the present disclosure. As shown in FIGS. 5-7, areas with dots represent the first pixel circuits PX1, and areas without dots represent the second pixel circuits PX2.

As shown in FIGS. 5-7, the first pixel circuits PX1 and the second pixel circuits PX2 are alternatively arranged. That is, one or more first pixel circuits PX1 are arranged after one or more second pixel circuits PX2 in a repeated pattern. The term "alternatively arranged" means that "if A and B are alternatively arranged, one or more As are arranged after one or more Bs in a repeated pattern." For example, as shown in FIG. 5, one first pixel circuit PX1 is arranged after one second pixel circuit PX2 in a repeated pattern. As shown in FIG. 6, one 2×1 array of first pixel circuits PX1 are arranged after one 2×1 array of second pixel circuits PX2 in a repeated pattern. As shown in FIG. 7, one 2×2 array of first pixel circuits PX1 are arranged after one 2×2 array of second pixel circuits PX2 in a repeated pattern. As shown in FIGS. 5-7, the first pixel circuits PX1 and the second pixel circuits PX2 are arranged in a checkerboard pattern.

The arrangements of the first pixel circuits PX1 and the second pixel circuits PX2 shown in FIGS. 5-7 are examples only, the claimed scope of the present disclosure should not be limited thereto. A person having ordinary skill in the art may select a proper arrangement for the first pixel circuits PX1 and the second pixel circuits PX2 based on actual demand.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An organic electroluminescence display comprising:
a plurality of scan lines;
a plurality of data lines crossing the plurality of scan lines;
a plurality of first pixel circuits forming a plurality of at least 2×2 first pixel circuit arrays, each of the first pixel circuits electrically connected to one of the plurality of scan lines and one of the plurality of data lines, wherein each of the first pixel circuit comprises:
at least one first organic light-emitting diode; and
at least one first driving transistor configured to actuate the at least one first organic light-emitting diode, wherein the at least one first driving transistor has a first channel in a first channel direction; and
a plurality of second pixel circuits forming a plurality of at least 2×2 second pixel circuit arrays, each of the second pixel circuits electrically connected to one of the plurality of scan lines and one of the plurality of data lines, wherein the at least one second pixel circuit comprises:
at least one second organic light-emitting diode; and
at least one second driving transistor configured to actuate the at least one second organic light-emitting diode, wherein the at least one second driving transistor has a second channel in a second channel direction, and the second channel direction is different from that of the first channel direction, wherein the at least 2×2 first pixel circuit arrays and the at least 2×2 second pixel circuit arrays are interlaced arranged in a repeated pattern along the first channel direction and the second channel direction.

2. The organic electroluminescence display of claim 1, wherein the at least one first driving transistor has a first source electrode and a first drain electrode, the first channel electrically connects the first source electrode and the first drain electrode, and the first channel direction extends across the first source electrode and the first drain electrode; and wherein the at least one second driving transistor has a second source electrode and a second drain electrode, the second channel electrically connects the second source electrode and the second drain electrode, and the second channel direction extends across the second source electrode and the second drain electrode.

3. The organic electroluminescence display of claim 1, wherein the first channel direction is substantially orthogonal to the second channel direction.

4. The organic electroluminescence display of claim 1, wherein the first channel and the second channel are formed by excimer laser annealing (ELA), the ELA has a laser scanning direction, and the first channel direction is different from that of the laser scanning direction.

5. The organic electroluminescence display of claim 4, wherein the second channel direction is substantially parallel with the laser scanning direction.

6. The organic electroluminescence display of claim 1, wherein the first channel and the second channel are formed by excimer laser annealing (ELA), the ELA has a laser scanning direction, and the first channel direction is substantially orthogonal to the laser scanning direction.

7. The organic electroluminescence display of claim 6, wherein the second channel direction is substantially parallel with the laser scanning direction.

8. An organic electroluminescence display comprising:
a plurality of scan lines;
a plurality of data lines crossing the plurality of scan lines;
a plurality of first pixel circuits forming a plurality of at least 2×2 first pixel circuit arrays, each of the first pixel circuits electrically connected to one of the plurality of scan lines and one of the plurality of data lines, wherein the at least one first pixel circuit comprises:
at least one first organic light-emitting diode; and
at least one first driving transistor configured to actuate the at least one first organic light-emitting diode, wherein the at least one first driving transistor has a first channel in a first lengthwise direction; and
a plurality of second pixel circuits forming a plurality of at least 2×2 second pixel circuit arrays, each of the second pixel circuits electrically connected to one of the plurality of scan lines and one of the plurality of data lines, wherein the at least one second pixel circuit comprises:

at least one second organic light-emitting diode; and
at least one second driving transistor configured to actuate the at least one second organic light-emitting diode, wherein the at least one second driving transistor has a second channel in a second lengthwise direction, and the first lengthwise direction and the second lengthwise direction intersect, wherein the at least 2×2 first pixel circuit arrays and the at least 2×2 second pixel circuit arrays are interlaced arranged in a repeated pattern along the first lengthwise direction and the second lengthwise direction.

9. The organic electroluminescence display of claim 8, wherein the at least one first driving transistor has a first source electrode and a first drain electrode, the first channel electrically connects the first source electrode and the first drain electrode, and the first lengthwise direction extends across the first source electrode and the first drain electrode; and wherein the at least one second driving transistor has a second source electrode and a second drain electrode, the second channel electrically connects the second source electrode and the second drain electrode, and the second lengthwise direction extends across the second source electrode and the second drain electrode.

10. The organic electroluminescence display of claim 8, wherein the first lengthwise direction is substantially orthogonal to the second lengthwise direction.

11. The organic electroluminescence display of claim 8, wherein the first channel and the second channel are formed by excimer laser annealing (ELA), the ELA has a laser scanning direction, and the first lengthwise direction and the laser scanning direction intersect.

12. The organic electroluminescence display of claim 11, wherein the second lengthwise direction is substantially parallel with the laser scanning direction.

13. The organic electroluminescence display of claim 8, wherein the first channel and the second channel are formed by excimer laser annealing (ELA), the ELA has a laser scanning direction, and the first lengthwise direction is substantially orthogonal to the laser scanning direction.

14. The organic electroluminescence display of claim 13, wherein the second lengthwise direction is substantially parallel with the laser scanning direction.

* * * * *